United States Patent [19]
Nix et al.

[11] Patent Number: 5,634,260
[45] Date of Patent: Jun. 3, 1997

[54] METHOD OF MAKING A MAGNETORESISTIVE DEVICE HAVING IMPROVED BARKHAUSEN NOISE SUPPRESSION

[75] Inventors: James L. Nix; Guy F. Ruse, both of Boulder; Paul D. Reinholz, Westminster; Anthony C. Helms, Lafayette, all of Colo.; Daniel J. O'Connor, Prior Lake, Minn.

[73] Assignee: Quantum Peripherals Colorado, Inc., Louisville, Colo.

[21] Appl. No.: 392,149

[22] Filed: Feb. 22, 1995

Related U.S. Application Data

[62] Division of Ser. No. 975,479, Nov. 12, 1992, abandoned.

[51] Int. Cl.$^6$ ............................................. G11B 5/42
[52] U.S. Cl. ........................... 29/603.14; 29/603.15
[58] Field of Search ........................... 29/603.14, 603.13, 29/603.15; 360/113

[56] References Cited

U.S. PATENT DOCUMENTS

| | | | |
|---|---|---|---|
| 3,840,898 | 10/1974 | Bajorek et al. | 360/113 |
| 4,639,806 | 1/1987 | Kira et al. | 360/113 |
| 4,663,685 | 5/1987 | Tsang | 360/113 |
| 4,713,708 | 12/1987 | Krounbi et al. | 360/113 |
| 4,759,118 | 7/1988 | Nakashima | 29/603.14 |
| 4,771,349 | 9/1988 | Tsang | 360/113 |
| 4,782,414 | 11/1988 | Krounbi et al. | 360/113 |
| 4,809,109 | 2/1989 | Howard et al. | 360/113 |
| 4,825,325 | 4/1989 | Howard et al. | 360/113 |
| 4,841,398 | 6/1989 | Mowry | 360/113 |
| 4,899,240 | 2/1990 | McClure | 360/113 |
| 5,005,096 | 4/1991 | Krounbi et al. | 360/113 |
| 5,116,719 | 5/1992 | Gau | 29/603.14 |
| 5,206,590 | 4/1993 | Dieny et al. | 360/113 |

FOREIGN PATENT DOCUMENTS

| | | |
|---|---|---|
| 375646 | of 1989 | Germany. |
| 422806 | of 1990 | Germany. |

OTHER PUBLICATIONS

Composite Films as a Domain-Wall Barrier—R.P. Hunt and A.A. Jaecklin Journal of Applied Physics, vol. 37, No. 3, 1 Mar. 66.

*Primary Examiner*—P. W. Echols
*Attorney, Agent, or Firm*—William J. Kubida; David B. Harrison; Holland & Hart LLP

[57] ABSTRACT

An improved magnetoresistive device and method for fabricating the same which results in improved Barkhausen noise suppression. A generally coplanar device is described having an MR structure conductive region longitudinally biased by opposing permanent magnet layers separated therefrom by a non-magnetic metal or dielectric separation layer. Significant reduction of the demagnetization energy near the MR-to-permanent magnet junction is achieved, particularly in the use of an elliptically shaped conductive region and the resultant generally coplanar device is readily fabricated and reproducible using a self-aligning process. The longitudinal bias technique described can be used in conjunction with all known transverse bias techniques.

37 Claims, 4 Drawing Sheets

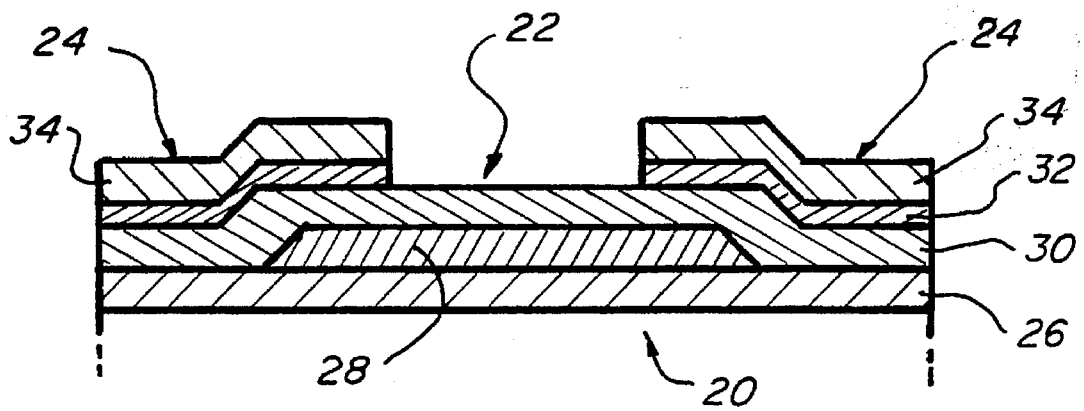
Fig_1
PRIOR ART
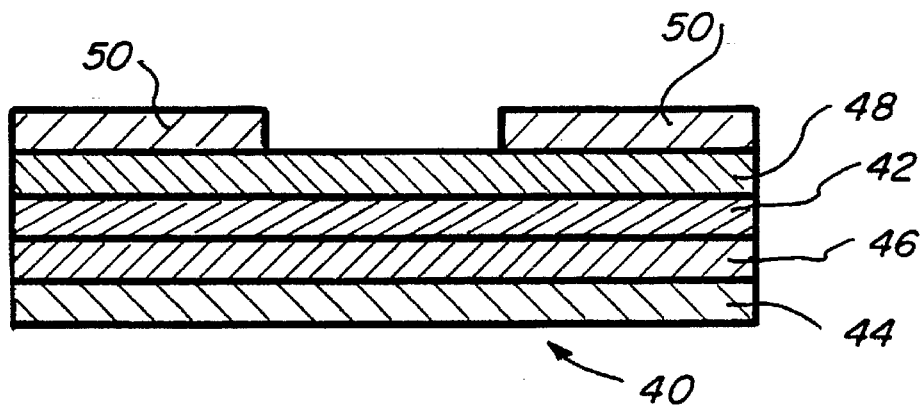
Fig_2
PRIOR ART
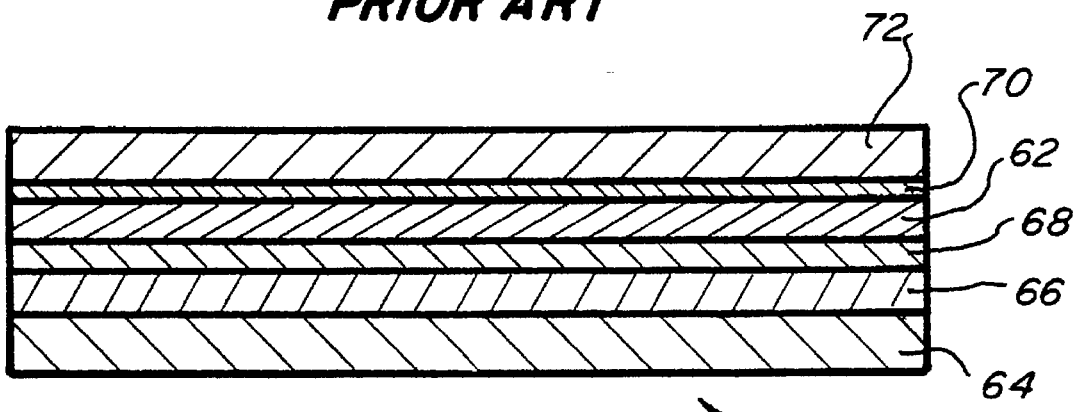
Fig_3
PRIOR ART

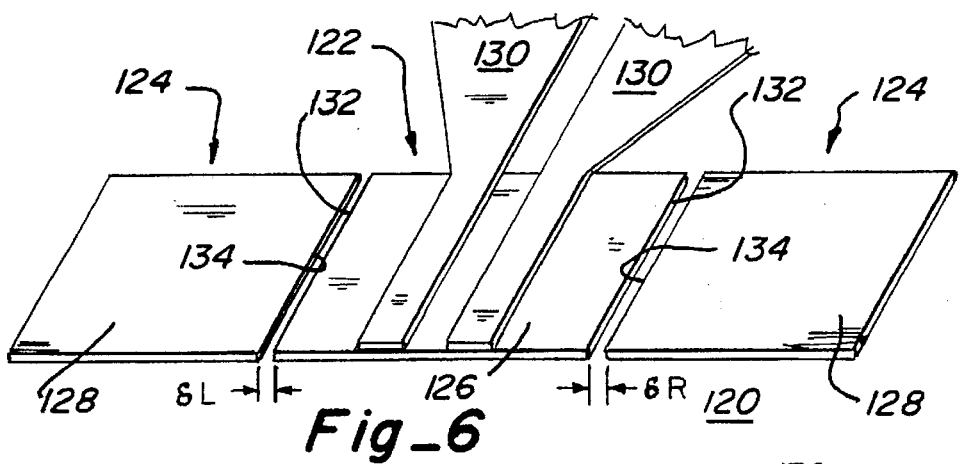
Fig_6
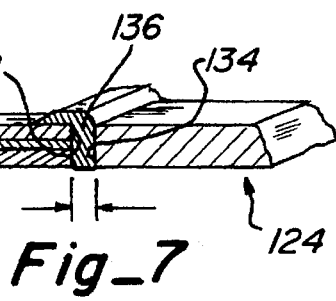
Fig_7
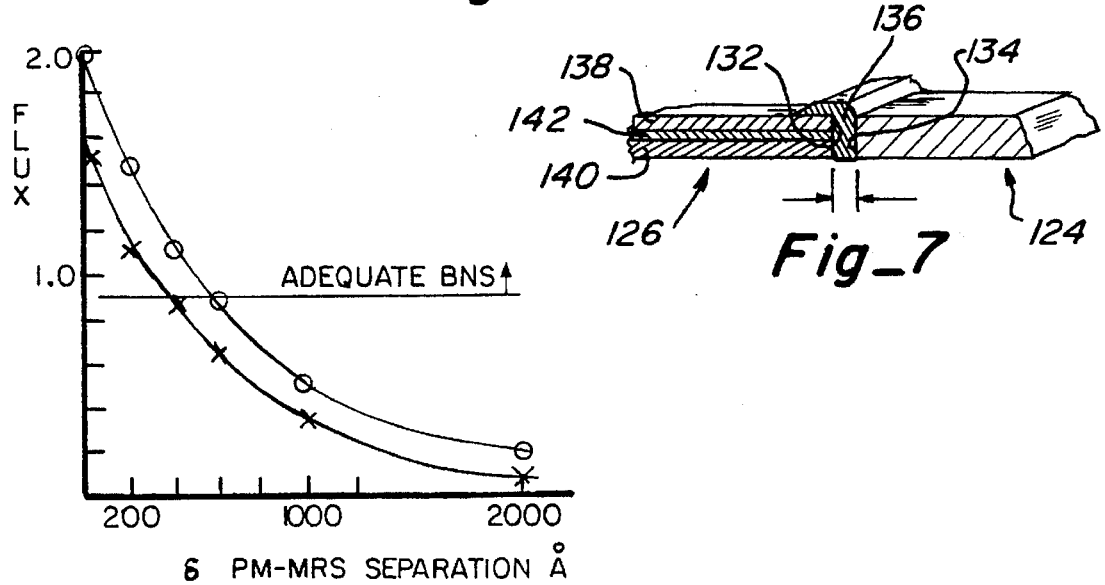
Fig_8
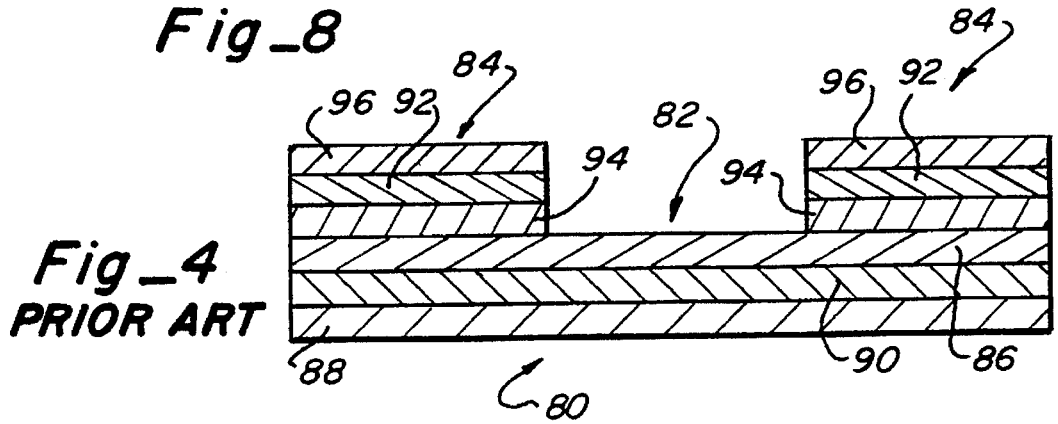
Fig_4 PRIOR ART
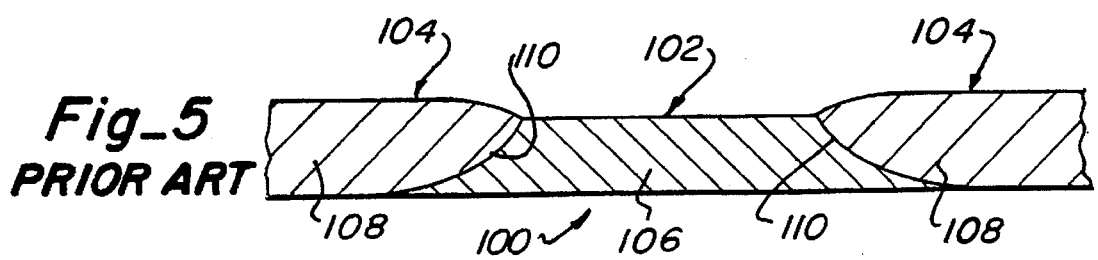
Fig_5 PRIOR ART

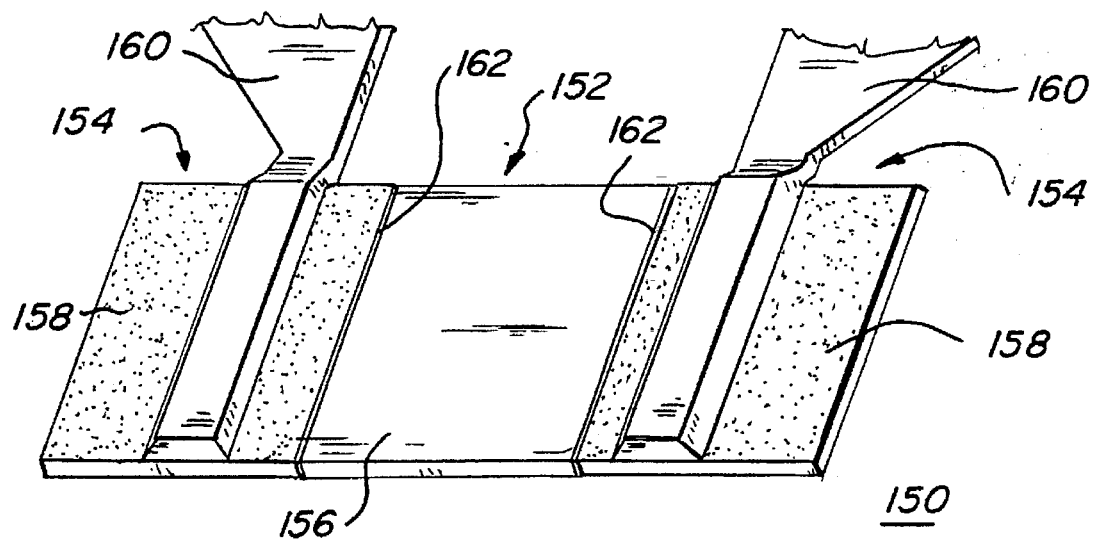
Fig_9
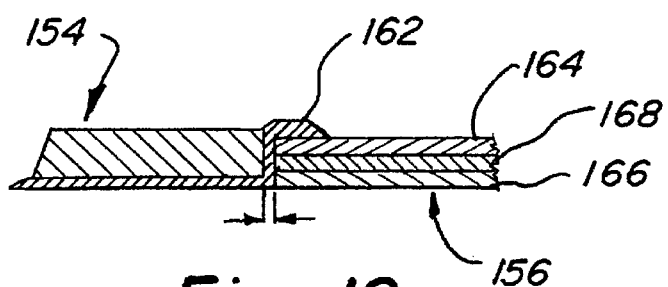
Fig_10
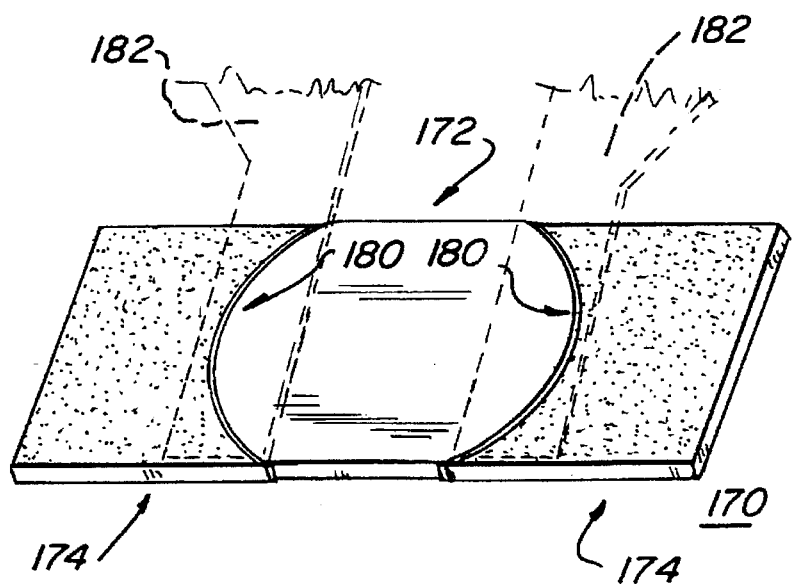
Fig_11

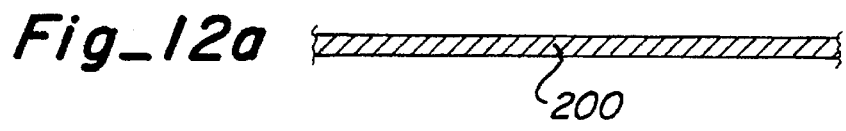
Fig_12a
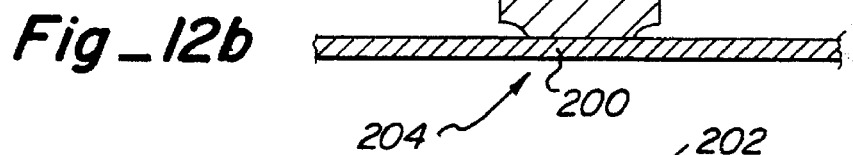
Fig_12b
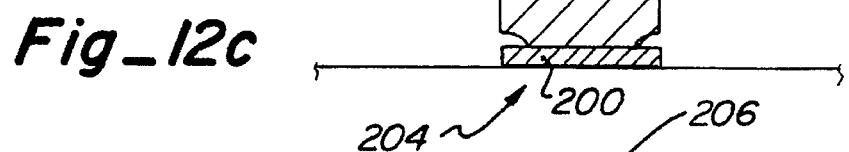
Fig_12c
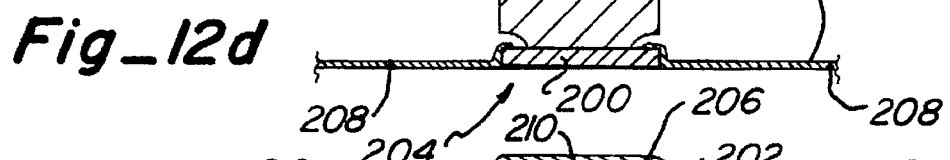
Fig_12d
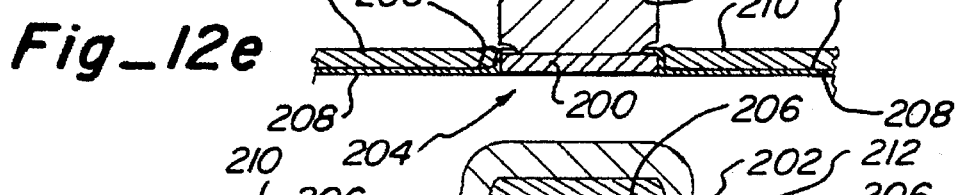
Fig_12e
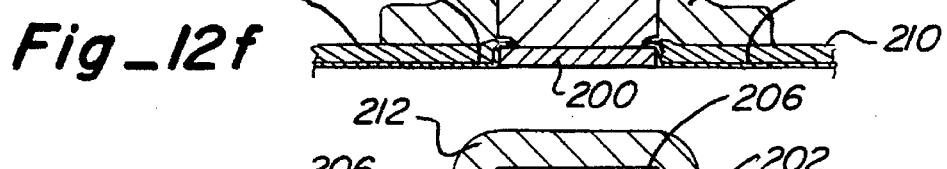
Fig_12f
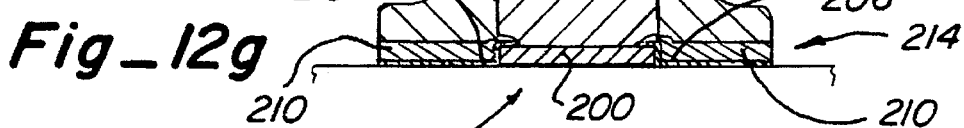
Fig_12g
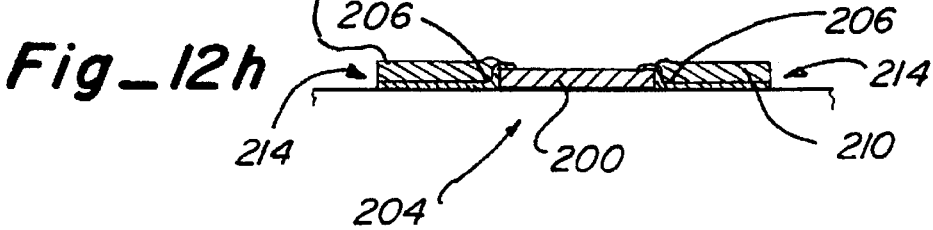
Fig_12h

METHOD OF MAKING A MAGNETORESISTIVE DEVICE HAVING IMPROVED BARKHAUSEN NOISE SUPPRESSION

This is a division of application Ser. No. 07/975,479, filed on Nov. 12 1992, now abandoned

BACKGROUND OF THE INVENTION

The present invention relates, in general, to the field of magnetoresistive ("MR") devices and methods for fabricating the same. More particularly, the present invention relates to magnetoresistive devices and processes for manufacturing the same for use as an MR sensor which exhibits improved Barkhausen noise suppression characteristics.

Magnetoresistive sensors or heads are known to be useful in reading data from a magnetic surface with a sensitivity exceeding that of inductive or thin film heads. In operation, a MR sensor is used to detect magnetic field signal changes from a magnetic surface due to the fact that the resistance of the MR sensor changes as a function of the direction and amount of magnetic flux being sensed. It is also generally known that for an MR sensor to function effectively, it must be subjected to a transverse bias field to linearize its response. Various techniques for effectuating such transverse biasing are known including current shunt biasing and soft adjacent film biasing. The transverse bias field is applied normal to the plane of the magnetic media and parallel to the surface of the MR sensor.

It is also known that an MR sensor may be utilized in conjunction with a longitudinal bias field extending parallel to the surface of the magnetic media and parallel to the major axis of the MR sensor. Stabilization of MR sensors by means of a longitudinal bias field is necessary for their application with high track density disk files in order to suppress Barkhausen noise. Barkhausen noise results from unstable magnetic properties such as multi-domain activities within the MR element.

With respect to the application of a longitudinal bias field for the suppression of Barkhausen noise in an MR sensor, a number of patents have issued in this area, primarily dealing with "exchange bias" through use of an antiferromagnet coupled in some manner to the MR device. Exemplary of these patents are U.S. Pat. No. 4,663,685 "Magnetoresistive Read Transducer Having Patterned Longitudinal Bias" issued May 5, 1987; U.S. Pat. No. 4,713,708 "Magnetoresistive Read Transducer" issued Dec. 15, 1987; U.S. Pat. No. 4,809,109 "Magnetoresistive Read Transducer and Method for Making the Improved Transducer" issued Feb. 28, 1989 and U.S. Pat. No. 4,825,325 "Magnetoresistive Read Transducer Assembly" issued Apr. 25, 1989. With these exchange bias MR sensors, the materials in current use to form an antiferromagnet, such as manganese and its alloys, are known to be highly reactive and have poor thermal characteristics.

In an attempt to solve the problems inherent with the use of an antiferromagnet to provide longitudinal bias, a number of patents and publications have described the use of an MR sensor stabilized through the use of permanent magnet films. Exemplary of the techniques known are those described in U.S. Pat. No. 4,639,806 "Thin Film Magnetic Head Having a Magnetized Ferromagnetic Film on the MR Element" issued Jan. 27, 1987; Hunt, R. P. and Jaecklin, A. A., "Composite Films as a Domain-Wall Barrier", Journal of Applied Physics, volume 37, no. 3, Mar. 1, 1966; European Patent Application No. 0,375,646 published Jun. 27, 1990 and European Patent Application No. 0,422,806 published Apr. 17, 1991. Some of the previous designs using permanent magnets for Barkhausen noise suppression by application of a longitudinal bias to the MR sensor have been shown to be generally not suited for use with closely coupled magnetic shielding layers. The remainder of the techniques previously described are not readily implementable and reproducible.

SUMMARY OF THE INVENTION

The magnetoresistive device according to the present invention includes a magnetoresistive structure having oppositely disposed end portions transverse to a major axis of the device. A pair of permanent magnet layers is disposed adjacent to, and spaced apart from, the end portions of the magnetoresistive structure in a generally coplanar relationship. A further embodiment of a magnetoresistive device in accordance with the present invention includes a magnetoresistive conductive region and a separation layer adjoining opposite end portions of the conductive region. First and second permanent magnet regions are contiguous with the separation layer at the end portions of the conductive region in order to provide a longitudinal bias to the magnetoresistive conductive region by means of the first and second permanent magnet regions. The longitudinal bias technique disclosed can be utilized in conjunction with all known transverse bias techniques including current shunt, barber pole and self-biasing methods.

In accordance with the method disclosed herein, a magnetoresistive device may be manufactured by defining a magnetoresistive conductive region on a magnetoresistive structure and overlying opposing end portions of the conductive region with an adjoining separation layer. First and second permanent magnet regions contiguous with the separation layer at the end portions of the conductive region are formed to provide longitudinal bias to the magnetoresistive conductive region. In accordance with an alternative process of the present invention, a magnetoresistive device may be formed by providing a magnetoresistive structure and defining a conductive region on the structure. The magnetoresistive structure is removed surrounding the conductive region and a separation layer is formed on the exposed surfaces of the magnetoresistive conductive region. A permanent magnet layer is produced adjoining the separation layer and the separation and permanent magnet layers which overlie the conductive region are removed in order that the remaining portions of the permanent magnet layer can provide a longitudinal bias to the conductive region.

In a more specific process according to the present invention a magnetoresistive device may be formed by producing a magnetoresistive structure on a device substrate and defining a conductive region within the structure. The magnetoresistive structure surrounding the conductive region is removed leaving exposed opposing end portions. A separation layer is then placed over the substrate and the magnetoresistive conductive region. A permanent magnet region contiguous with the separation layer is formed and the separation layer and permanent magnet region is removed from the conductive region except at the exposed end portions thereof.

BRIEF DESCRIPTION OF THE DRAWINGS

The above-mentioned and other features and objects of the invention and the manner of attaining them will become more apparent and the invention itself will be best understood by reference to the following description of an embodiment of the invention taken in conjunction with the accompanying drawings, wherein:

FIG. 1 is a cross-sectional view of a prior art MR head in which longitudinal bias to suppress Barkhausen noise is provided through exchange bias utilizing an antiferromagnet;

FIG. 2 is another cross-sectional representation of a prior art MR sensor utilizing the exchange bias technique;

FIG. 3 illustrates another cross-sectional view of a prior art MR head including an antiferromagnetic layer and overlying capping layer;

FIG. 4 illustrates another cross-sectional view of a prior art MR read transducer utilizing a hard magnetic material for providing longitudinal bias to the MR read transducer;

FIG. 5 is a cross-sectional view of yet another prior art MR read transducer also illustrating the application of longitudinal bias to an MR read transducer through the use of a hard magnetic layer;

FIG. 6 is a partial isometric view of a magnetoresistive device in accordance with the present invention illustrating an exaggerated separation between the magnetoresistive conductive region and the adjoining permanent magnet regions for providing longitudinal bias to the conductive region for Barkhausen noise suppression (BNS);

FIG. 7 is a partial cross-sectional view of the desired separation maintained between a permanent magnet region and a magnetoresistive structure by means of a separation layer;

FIG. 8 is a graphic representation of desired permanent magnet (PM) to magnetoresistive structure (MRS) separation in angstroms sufficient to provide adequate Barkhausen noise suppression;

FIG. 9 is a partial isometric view of an alternative embodiment of a magnetoresistive device in accordance with the present invention showing conductive leads contacting the permanent magnet regions when a non-magnetic metal separation layer between the magnetoresistive conductive region and the permanent magnet regions is utilized;

FIG. 10 is another partial, cut-away cross-sectional view of a magnetoresistive device in accordance with the present invention further illustrating the separation layer between the magnetoresistive structure and the adjoining permanent magnet region as may be utilized in the embodiments shown in FIGS. 9 and 11;

FIG. 11 is a preferred embodiment of the present invention illustrating a magnetoresistive device having an elliptical conductive region providing significant advantages in lowering the demagnetization energy density near the magnetoresistive conductive region-to-permanent magnet region Junction; and FIGS. 12a–12h are simplified cross sectional views illustrative of a self-aligned process flow for manufacturing a magnetoresistive device in accordance with the present invention.

DESCRIPTION OF A PREFERRED EMBODIMENT

With reference to FIG. 1, a prior art MR head 20 such as described in U.S. Pat. No. 4,713,708 is shown. MR head 20 includes an active region 22 in conjunction with passive end regions 24. A non-magnetic spacer layer 28 overlies the MR layer 26 in the active region 22 but not within the passive end regions 24. An antiferromagnetic layer 32 overlies the soft magnetic film 30 in the passive end regions and conductor leads 34 overlie the antiferromagnetic layer 32. Utilizing this technique, longitudinal bias is achieved by not having within the passive end regions 24, a nonmagnetic spacer layer 28 interposed between the MR layer 26 and the soft magnetic film 30. In this manner, an exchange biasing effect propagates from the longitudinal biasing layer through the MR layer 26 to the soft magnetic film 30. Through magnetostatic and exchange coupling along MR layer 26, a single domain state is induced in active region 22 through the single domain states of passive end regions 24.

With reference additionally to FIG. 2, another prior art MR sensor such as described in U.S. Pat. No. 4,809,109 is shown. MR sensor 40 includes a layer of ferromagnetic material 42 such as NiFe. A non-magnetic spacer 46 separates ferromagnetic material 42 from a soft magnetic film layer 44. Antiferromagnetic material 48 overlies ferromagnetic material 42 as shown.

Antiferromagnetic material 48 is described as FeMn. A pair of leads 50 is attached to MR sensor 40 by contacting antiferromagnetic material 48 as shown. The antiferromagnetic material 48 provides exchange bias to MR sensor 40 as previously described.

Referring also now to FIG. 3, a prior art MR head 60 such as described in United States Patent No. 4,825,325 is shown. MR head 60 comprises an NiFe MR layer 62. Substrate 64 has formed thereon a soft magnetic material 66 and a nonmagnetic spacer layer 68 underlying the MR layer 62. An antiferromagnetic layer 70 on the order of less than 25 to 50 angstroms, overlies the MR layer 62. A capping layer 72 overlies the antiferromagnetic layer to prevent oxidation damage due to the highly reactive nature of the ferromanganese antiferromagnetic layer 70. Capping layer 72 is described as a stable dielectric.

In each of the previously described prior art embodiments utilizing "exchange bias" techniques through the use of an antiferromagnet, significant problems with poor thermal characteristics and the highly reactive nature of the antiferromagnetic materials are encountered.

With reference to FIG. 4, a prior art MR read transducer 80 such as described in European Patent Application No. 0,375,646 is shown. MR read transducer 80 includes an MR layer 86 having passive end regions 84 separated by an active region 82. Longitudinal bias to MR read transducer 80 is provided by means of hard magnetic material 92 in the passive end regions 84 only. Hard magnetic material 92 is vertically separated from MR layer 86 by non-magnetic separation layer 94 as shown. Another non-magnetic spacing layer 90 separates MR layer 86 from soft magnetic layer 88. Longitudinal bias of the MR layer 86 in the active region 82 is provided by means of the hard magnetic material 92 located over the passive end regions 84. Conductor leads 96 contact hard magnetic material 92 in passive end regions 84. The stacked nature of the resultant device is less satisfactory than one which is generally coplanar.

Referring now to FIG. 5, a prior art MR read transducer 100 in accordance with the description of European Patent Application 0,422,806 is shown. MR read transducer 100 includes an active region 102 and passive end regions 104. MR layer 106 in active region 102 is longitudinally biased by means of hard magnetic layers 108 in passive end regions 104. MR layer 106 is in direct contact magnetically and electrically with hard magnetic layers 108 through abutting junctions 110. As described in the patent application, the profile of the abutting Junction includes two overlapping tapers which are a tradeoff between electrical and magnetic reliability.

With reference to FIG. 6, a simplified view of a magnetoresistive device 120 in accordance with the present invention is shown. Magnetoresistive device 120 includes a central conductive region 122 and opposing permanent magnet regions 124. Conductive region 122 may comprise a magnetoresistive structure 126 (MRS) which, in a preferred embodiment, may include the trilayer structure illustrated additionally in FIG. 7. Magnetoresistive structure 126 may, therefore, include an MR layer 138 (for example, 200–500 angstroms of NiFe) and an underlying soft magnetic layer 140 which may comprise 200–500 angstroms of NiFeMo. Soft magnetic layer 140 may also be referred to as soft adjacent layer (SAL). It should be noted that in certain applications, it may be desirable that soft magnetic layer 140 overlie MR layer 138. Magnetic spacing layer (MSL) 142 may be formed of 100–250 angstroms of tantalum.

Permanent magnet regions 124 are formed of a permanent magnet layer 128 which, in a preferred embodiment, may comprise CoPt or other cobalt alloys such as CoCr. A pair of conductive leads 130, which may comprise Au, contact magnetoresistive device 120 at conductive region 122 although electrical contact may be made to permanent magnet regions 124 when a non-magnetic metal is utilized for separation layer 136 in lieu of a dielectric material.

Referring additionally to FIG. 8, separation between permanent magnet (PM) regions 124 and the magnetoresistive structure (MRS) 126 is shown to be most desirable in the region of 50 to 250 angstroms. Separation on the order of 400 angstroms or less for shielded MR heads is considered to provide adequate Barkhausen noise suppression (BNS) by providing longitudinal bias to conductive region 122 of magnetoresistive device 120 to induce a single domain state therein. Separation between conductive region 122 and permanent magnet regions 124 may be maintained by means of separation layer 136. Separation layer 136 may be a nonmagnetic metal such as chromium or, alternatively, a dielectric material such as aluminum oxide sufficient for maintaining the desired separation between conductive region 122 and permanent magnet regions 124.

Referring additionally now to FIG. 9, an alternative embodiment of a magnetoresistive device 150 in accordance with the present invention is shown. Magnetoresistive device 150 comprises a conductive region 152 separated from adjoining permanent magnet regions 154. Conductive region 152 may comprise MR structure 156 as further illustrated in cross-sectional detail in FIG. 10. As with the previously described embodiment, MR structure 156 may comprise a trilayer structure including MR layer 164 and underlying soft magnetic layer 166. Magnetic spacing layer 168 is interposed between MR layer 164 and soft magnetic layer 166. Permanent magnet regions 154 are made up of a permanent magnet layer 158 and are separated from conductive region 152 by means of separation layer 162. In the embodiment of FIG. 9, conductive leads 160 contact magnetoresistive device 150 at permanent magnet regions 154. This is possible through the use of a nonmagnetic metal such as chromium for separation layer 162 in lieu of a dielectric.

The magnetoresistive device 150 conductive region 152 is, preferably, as long as the desired track width dimension of the device. Use of a nonmagnetic metal separation layer 162 allows conductive leads 160 to contact permanent magnet regions 154 obviating the undesirable current shunting effects which are normally encountered when electrical contact is made directly to conductive region 152.

Referring additionally now to FIG. 11, a preferred embodiment for magnetoresistive device 170 in accordance with the present invention is shown. In this embodiment, conductive region 172 is formed into an elliptical shape.

Permanent magnet regions 174 remain separated from conductive region 172 in the manner aforedescribed and shown in FIG. 10. The use of an elliptical shape for conductive region 172 provides significant advantages in lowering the demagnetization energy density near the conductive region 172 to permanent magnet regions 174 junction. Similar advantages utilizing variations in the conductive region 172 shape technique illustrated in FIG. 11 over the orthogonal boundaries hereinbefore described may be inferred and the use of other conic section shapes, curvilinear spacing regions or non-orthogonal boundaries between conductive region 172 and permanent magnet regions 174 may be employed.

Elliptical end portions 180 of conductive region 172 may be contacted by conductive leads 182, for example substantially as shown in phantom lines.

Referring additionally now to FIG. 12, a representative process flow for manufacturing a magnetoresistive device in accordance with the present invention is shown. MR structure 200, which may be a trilayer structure as previously described, is patterned with photoresist 202 to define an MR conductive region 204. Portions of MR structure 200 not covered by photoresist 202 are etched away as shown in FIG. 12c. Separation layer 206 is deposited on the exposed end structure of substrate 108 such that separation layer 2306 adjoins the end portions of MR structure 200 at conductive region 204 to produce substantially the structure shown previously in FIGS. 7 and 10. Separation layer 206 also overlies photoresist 202 as shown. Separation layer 206 may comprise a non-magnetic metal 208 or, alternatively, a dielectric material such as aluminum oxide. Permanent magnet regions 210 are formed on top of separation layer 206 as shown in FIG. 12e including those portions overlying photoresist 202. Permanent magnet regions 210 may be deposited isotropically and later set in orientation along the major axis of the magnetoresistive device by the application of a suitable magnetic field following the final processing steps. Alternatively, permanent magnet regions 210 may be deposited anisotropically. An additional photoresist process step as shown in FIG. 12f is employed to pattern photoresist 212 over the combined structure preparatory to an ion milling step as shown in FIG. 12g to etch away the remainder of the permanent magnet regions 210 and separation layer 206 to leave device ends 214. As a final processing step, the photoresist is removed from the device leaving a magnetoresistive device in accordance with the present invention as shown in FIG. 12h, having a magnetoresistive active region separated from coplanar permanent magnet regions for providing longitudinal bias thereto.

FIG. 12c shows a magnetoresistive structure 200 or magnetoresistive conductive region 204 in the form of a magnetoresistive mesa 200,204. This FIG. 12c MR mesa structure is formed from FIG. 12a's magnetoresistive structure 200 by the use of FIG. 12b's patterned photoresist 202, followed by FIG. 12c's etching step that removes the two exposed end portions of FIG. 12b's magnetoresistive structure 200. As is shown in FIG. 12d, the two exposed and opposing sidewalls of FIG. 12c3 s mesa-shaped magnetoresistive conductive region 204 are now overlayed with a non-magnetic or dielectric separation layer 206. A permanent magnet layer 210 is thereafter produced in a position that adjoins the above described separation layer 206, as is shown in FIG. 12e. In a preferred embodiment of the invention, an elliptical magnetoresistive mesa 172 is formed as is shown in FIG. 11.

In the embodiments of the present invention, the matching of the magnetic fluxes of the composite of the MR film and permanent magnet films form a substantially continuous magnetic body with very low demagnetization energy in the vicinity of the MR-permanent magnet junction. This is especially true in the utilization of an elliptically shaped magnetoresistive conductive region. The coercivity of the MR sensor is then very low on average but the coercivity of the permanent magnet portion of the magnet body is very high. Therefore, the composite film group is not switched during normal operation of the device. The tight magnetostatic coupling results in a net easy axis field inside the MR sensor which maintains the device in a single domain state and, thus, suppresses Barkhausen noise.

The magnetoresistive device and method of the present invention is readily utilized with closely spaced ferromagnetic shields, which can present gap lengths (MRS to shield spacing) of approximately 1,000 to 4,000 angstroms. Desired permanent magnet region to MR conductive region spacing is most advantageous in the range of an order of magnitude less than the gap length. Therefore, a 2,000 angstrom gap length would indicate a 200 angstrom permanent magnet to MR conductive region spacing.

While there have been described above the principles of the present invention in conjunction with specific apparatus and processing steps, it is to be clearly understood that this description is made only by way of example and not as a limitation to the scope of the invention.

What is claimed is:

1. A method for forming a magnetoresistive device comprising the steps of:

defining a magnetoresistive conductive region on a magnetoresistive structure, said magnetoresistive conductive region having first and second end portions;

overlying said first and second end portions of said magnetoresistive conductive region with a first and a second separation layer, respectively; and forming first and second permanent magnet regions that are generally contiguous with said first and second separation layers, respectively, and that are adjacent to said first and second end portions of said conductive region, respectively, to provide longitudinal bias to said magnetoresistive conductive region.

2. The method of claim 49 wherein said step of providing includes the steps of:

patterning photoresist on said magnetoresistive structure to define said magnetoresistive conductive region; and etching away said magnetoresistive structure surrounding said patterned photoresist.

3. The method of claim 1 wherein said step of providing produces a generally elliptical magnetoresistive conductive region.

4. The method of claim 1 wherein said step of overlying includes the step of:

depositing a non-magnetic metal.

5. The method of claim 4 wherein said step of depositing is carried out by means of chromium.

6. The method of claim 1 wherein said step of overlying includes the step of:

depositing a dielectric material.

7. The method of claim 1 wherein said step of forming includes the step of:

depositing said first and second permanent magnet regions as hard magnetic material.

8. The method of claim 7 wherein said step of depositing is carried out by means of CoPt.

9. The method of claim 11 further comprising the steps of:

patterning photoresist on portions of said first and second separation layers and on portions of said first and second permanent magnetic regions to define said magnetoresistive device;

etching away other portions of said first and second separation layers and other portions of said first and second permanent magnet regions that are not patterned by said patterned photoresist; and removing said patterned photoresist.

10. The method of claim 9 wherein said step of etching is carried out by means of ion beam milling.

11. A method for forming a magnetoresistive device comprising the steps of:

forming a magnetoresistive mesa from a magnetoresistive structure, said magnetoresistive mesa having two physically spaced sidewall portions;

overlying said two sidewall portions of said magnetoresistive mesa with a first and a second separation layer, respectively; and producing a permanent magnet layer adjoining said first and second separation layers to provide longitudinal bias to said magnetoresistive mesa.

12. The method of claim 11 wherein said step of forming is carried out by means of patterned photoresist.

13. The method of claim 11 wherein said step of forming produces a generally elliptical magnetoresistive mesa.

14. The method of claim 11 wherein said step of overlying is carried out by means of deposition of a non-magnetic metal.

15. The method of claim 11 wherein said step of overlying is carried out by means of deposition of a dielectric material.

16. The method of claim 11 wherein said step of producing is carried out by means of deposition of a hard magnetic material.

17. A method for forming a magnetoresistive device comprising the steps of:

providing a magnetoresistive structure;

forming a magnetoresistive conductive region from said magnetoresistive structure by removing said magnetoresistive structure surrounding said magnetoresistive region to provide a maqnetoresistive region having first and second exposed surfaces;

overlying a first and a second separation layer on said first and second exposed surfaces respectively of said magnetoresistive conductive region;

producing a first and a second permanent magnet layer adjoining said first and second separation layers, respectively; and removing portions of said first and second separation layers and said first and second permanent magnet layers whereby remaining portions of said first and second permanent magnet layers provide longitudinal bias to said magnetoresistive conductive region.

18. The method of claim 17 wherein said step of providing is carried out by means of a magnetoresistive layer separated from a soft magnetic layer.

19. The method of claim 17 wherein said step of forming is carried out by means of patterned photoresist.

20. The method of claim 17 wherein said step Of forming provides a generally elliptical magnetoresistive conductive region.

21. The method of claim 17 wherein removing said magnetoresistive structure surrounding said magnetoresistive region is carried out by etching.

22. The method of claim 17 wherein said step of overlying is carried out by the deposition of a non-magnetic metal.

23. The method of claim 17 wherein said step of overlying is carried out by the deposition of a dielectric material.

24. The method of claim 17 wherein said step of producing is carried out by the deposition of a hard magnetic material.

25. The method of claim 17 wherein said step of removing portions of said first and second separation layers and said first and second permanent magnet layers comprises the steps of:

patterning photoresist on said first and second permanent magnet layers to define said magnetoresistive device; and etching away said first and second separation layers and said first and second permanent magnet layers surrounding said patterned photoresist.

26. The method of claim 25 wherein said step of etching is carried out by means of ion beam milling.

27. A method for forming a magnetoresistive device comprising the steps of:

producing a magnetoresistive structure on a device substrate;

forming a magnetoresistive conductive region within said magnetoresistive structure by removing said magnetoresistive structure surrounding said magnetoresistive conductive region leaving exposed and opposing end portions thereof;

overlying said substrate and said magnetoresistive conductive region with a separation layer;

forming a permanent magnet region contiguous with said separation layer; and removing said separation layer and said permanent magnet region from said magnetoresistive conductive region except at said exposed opposing end portions thereof whereby portions of said permanent magnet region adjoining said exposed opposing end portions of said magnetoresistive conductive region provide a longitudinal bias thereto.

28. The method of claim 27 wherein said step of producing comprises the steps of:

providing a device substrate; and depositing said magnetoresistive structure on said substrate.

29. The method of claim 28 wherein said step of depositing further comprises the steps of:

firstly depositing a soft magnetic layer on said substrate; and nextly depositing a magnetic spacing layer on said soft magnetic layer.

30. The method of claim 27 wherein said step of forming is carried out by means of patterned photoresist.

31. The method of claim 27 wherein said step of forming produces a generally elliptical magnetoresistive conductive region.

32. The method of claim 27 wherein said removing of said magnetoresistive structure surrounding said magnetoresistive conductive region comprises the step of:

etching away said magnetoresistive structure surrounding said magnetoresistive conductive region.

33. The method of claim 27 wherein said step of overlying comprises the step of depositing a nonmagnetic metal.

34. The method of claim 27 wherein said step of overlying comprises the step of depositing a dielectric material.

35. The method of claim 27 herein said step of forming comprises the step of depositing a hard magnetic material.

36. The method of claim 27 wherein said step of removing said separation layer and said permanent magnet region from said magnetoresistive conductive region except at said exposed opposing end portions thereof comprises the steps of:

patterning photoresist to define said magnetic device; and etching away said separation layer and said permanent magnet region surrounding said patterned photoresist.

37. The method of claim 36 wherein said step of etching is carried out by ion beam milling.

* * * * *